(12) United States Patent
Fujimoto (10) Patent No.: US 8,786,306 B2
(45) Date of Patent: Jul. 22, 2014

(54) INSPECTION DEVICE AND INSPECTION METHOD

(75) Inventor: Shuichiro Fujimoto, Miyazaki (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 421 days.

(21) Appl. No.: 13/271,607

(22) Filed: Oct. 12, 2011

(65) Prior Publication Data

US 2012/0092038 A1    Apr. 19, 2012

(30) Foreign Application Priority Data

Oct. 14, 2010   (JP) ................................. 2010-231405

(51) Int. Cl.

| | |
|---|---|
| G01R 31/26 | (2014.01) |
| G01R 31/3177 | (2006.01) |
| G06F 1/24 | (2006.01) |
| G11C 5/14 | (2006.01) |
| H03K 17/22 | (2006.01) |

(52) U.S. Cl.
CPC .............. *G01R 31/3177* (2013.01); *G06F 1/24* (2013.01); *G11C 5/148* (2013.01); *H03K 17/223* (2013.01)
USPC .................................................. 324/762.03

(58) Field of Classification Search
None
See application file for complete search history.

(56) References Cited

U.S. PATENT DOCUMENTS 4,983,857 A * 1/1991 Steele ............................ 327/143
6,650,155 B1 * 11/2003 Nguyen et al. ................ 327/143

FOREIGN PATENT DOCUMENTS

| JP | 2003-248598 A | 9/2003 |
| JP | 2004-279052 A | 10/2004 |
| JP | 2008-017101 A | 1/2008 |
| JP | 2009-036591 A | 2/2009 |
| JP | 2010-109717 A | 5/2010 |

OTHER PUBLICATIONS

Japanese Office Action dated Mar. 18, 2014.

* cited by examiner

*Primary Examiner* — Paresh Patel
(74) *Attorney, Agent, or Firm* — Rabin & Berdo, P.C.

(57) ABSTRACT

The present invention provides semiconductor integrated circuit, inspection device and inspection method for inspecting whether inspection target is functioning normally regardless to start-up period of a power supply voltage. The inspection device includes a reset control circuit and a tester. When a reset signal is inputted from a power-on reset circuit to a first terminal, the reset control circuit starts output of a reset execution signal having the same level as the reset signal. When a trigger signal is inputted from a control device to the second input terminal, the reset control circuit finishes the output of the reset execution signal and starts output of a release execution signal that has the same level as a reset release signal from the output terminal. The tester determines whether the power-on reset circuit is functioning normally by determining whether signals outputted from the reset control circuit are at predetermined levels.

10 Claims, 6 Drawing Sheets

INSPECTION DEVICE AND INSPECTION METHOD

CROSS-REFERENCE TO RELATED APPLICATION

This application claims priority under 35 USC 119 from Japanese Patent Application No. 2010-231405 filed on Oct. 14, 2011, the disclosure of which is incorporated by reference herein.

BACKGROUND OF THE INVENTION

1. Field of the Invention

The present invention relates to an inspection device and an inspection method. The present invention particularly relates to an inspection device and inspection method for inspecting operational states of a power-on reset circuit for initializing a logic circuit when a DC voltage is applied.

2. Description of the Related Art

When a DC voltage is applied (when power is turned on) as a power supply voltage to a semiconductor integrated circuit that includes latch circuits, flip-flops and the like, logical values of signals output from the semiconductor integrated circuit may not be stabled. Accordingly, a power-on reset circuit (hereinafter referred to as "PoR circuit") for consistently providing predetermined values (values that have been reset) as logical values of the signals that are outputted, when the DC voltage is applied, is provided in the semiconductor integrated circuit (for example, see Japanese Patent Application Laid-Open (JP-A) No. 2008-17101). To enhance the reliability of the semiconductor integrated circuit, it is important to inspect whether or not the PoR circuit is functioning normally.

Figure 5:
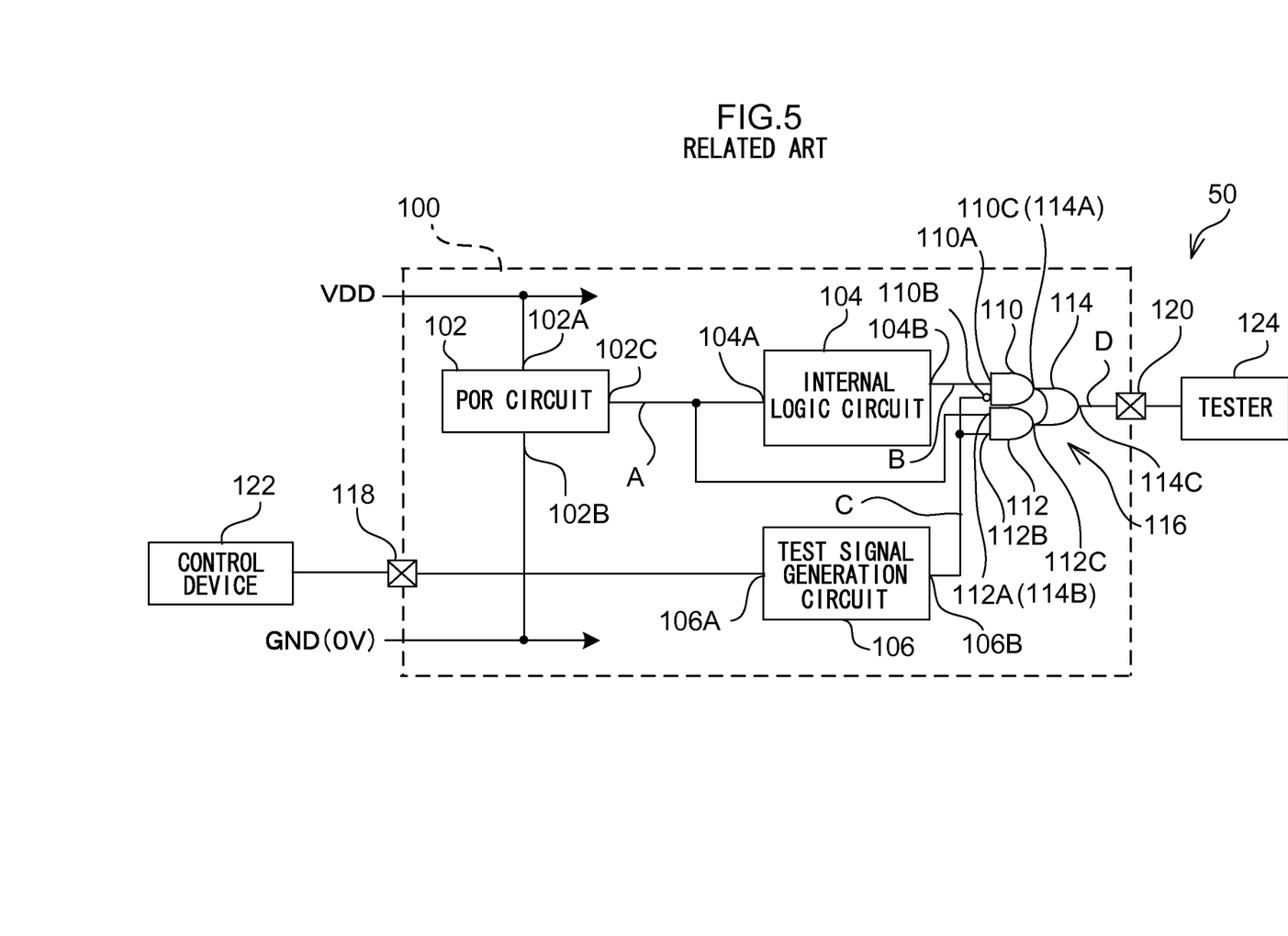
FIG. 5 is a diagram illustrating an example of a conventional inspection device.

FIG. 5 illustrates an example of a conventional inspection device 50. As illustrated in FIG. 5, the inspection device 50 includes elements that configure a part of a semiconductor integrated circuit 100, a control device 122 and a tester 124. The semiconductor integrated circuit 100 includes a PoR circuit 102, an internal logic circuit 104, a test signal generation circuit 106, a selector circuit 116, an external input terminal 118 and an external output terminal 120. The PoR circuit 102 includes a voltage application terminal 102A, a grounded terminal 102B and an output terminal 102C. The internal logic circuit 104 includes an input terminal 104A and an output terminal 104B. The test signal generation circuit 106 includes an input terminal 106A and an output terminal 106B. The selector circuit 116 is a multiplexer, and includes AND circuits 110 and 112 and an OR circuit 114. A DC voltage VDD is applied to the inspection device 50 and the semiconductor integrated circuit 100 as the power supply voltage.

When the DC voltage VDD is applied to the semiconductor integrated circuit 100, the PoR circuit 102 initializes the internal logic circuit 104 (hereinafter referred to as "resetting"). At the PoR circuit 102, the output terminal 102C is connected to the input terminal 104A of the internal logic circuit 104 via a signal line A. The DC voltage VDD is applied to the voltage application terminal 102A, and a ground voltage (GND) is applied to the grounded terminal 102B. The PoR circuit 102 outputs a low-level reset signal for a period, specified in advance as start-up period of the DC voltage VDD, to reset the internal logic circuit 104. When the rising of the DC voltage VDD has finished, that is, when the period specified in advance has elapsed since application of the DC voltage VDD, the PoR circuit 102 uses the rising of the DC voltage VDD to raise (transit) the signal level of the reset signal from low level to high level, in order to release the reset state of the internal logic circuit 104.

The input terminal 106A of the test signal generation circuit 106 is connected to the external input terminal 118. When the rise of the DC voltage VDD stops, that is, when the period specified in advance as the rise time of the DC voltage VDD has elapsed, the test signal generation circuit 106 outputs a test signal with a predetermined signal level from the output terminal 106B, and fixes the signal level thereof.

The AND circuit 110 of the selector circuit 116 includes a positive logic input terminal 110A, a negative logic input terminal 110B, and an output terminal 110C. The positive logic input terminal 110A is connected to the output terminal 104B of the internal logic circuit 104 via a signal line B. The negative logic input terminal 110B is connected to the output terminal 106B of the test signal generation circuit 106 via a signal line C. The AND circuit 112 of the selector circuit 116 includes positive logic input terminals 112A and 112B, and an output terminal 112C. The positive logic input terminal 112A is connected to the signal line A and the positive logic input terminal 112B is connected to the signal line C. Further, the OR circuit 114 of the selector circuit 116 includes positive logic input terminals 114A and 114B, and an output terminal 114C. The positive logic input terminal 114A is connected to the output terminal 110C of the AND circuit 110, the positive logic input terminal 114B is connected to the output terminal 112C of the AND circuit 112, and the output terminal 114C is connected to the external output terminal 120 via a signal line D. Therefore, in accordance with the test signal outputted from the test signal generation circuit 106, the selector circuit 116 outputs a signal to the external output terminal 120 that has the same level as one of the signals inputted from the internal logic circuit 104 and the signal inputted from the PoR circuit 102.

The control device 122 is connected to the external input terminal 118. The control device 122 controls operation of the semiconductor integrated circuit 100. When the rise of the DC voltage VDD has ended, the control device 122 outputs an instruction signal to the test signal generation circuit 106 via the external input terminal 118 that instructs the start of output of the test signal. In response, the test signal generation circuit 106 generates the test signal with a predetermined signal level, and outputs the test signal through the output terminal 106B.

An input terminal of the tester 124 is connected to the external output terminal 120. From logical values of signals inputted from the selector circuit 116 via the external output terminal 120, the tester 124 inspects whether the PoR circuit 102 is functioning normally.

Figure 6:
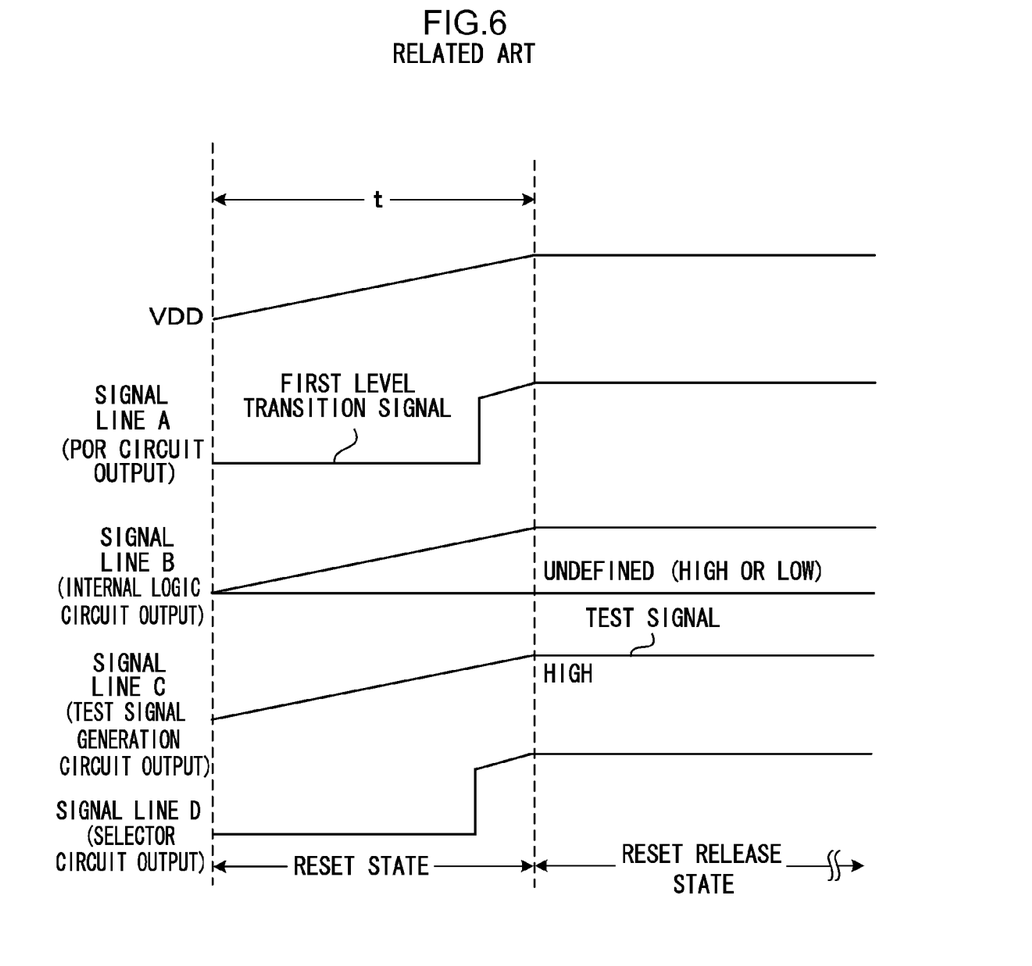
FIG. 6 is a timing chart illustrating operation timings of the conventional inspection device.

FIG. 6 illustrates transiting states of signal levels of the signal lines A to D, when the DC voltage VDD is being applied to the inspection device 50 and the semiconductor integrated circuit 100. As illustrated in a timing chart for signal line A in FIG. 6, the PoR circuit 102 starts output of the low-level reset signal when application of the DC voltage VDD is started. In response, the signal level of the signal outputted from the internal logic circuit 104 becomes a high level or a low level, as illustrated by the timing chart for signal line B in FIG. 6. Here, the selector circuit 116 outputs a signal representing the logical sum (OR) of, the logical product (AND) of the signal inputted from the internal logic circuit 104 and the high-level signal to which the low-level signal inputted from the test signal generation circuit 106 is inverted, and the logical product of the reset signal inputted from the PoR circuit 102 and the low-level signal inputted from the test signal generation circuit 106. Note that the timing chart for signal line D in FIG. 6 illustrates an example of the state in which a low-level signal is outputted from the selector circuit 116.

However, as illustrated by the timing chart for signal line A in FIG. 6, when the signal level of the reset signal rises to high level using the rise of the DC voltage VDD, the test signal generation circuit 106 outputs the test signal in response to the instruction from the control device 122 simultaneously with the rise of the reset signal. At this time, the selector circuit 116 outputs a signal representing the logical sum of, the logical product of the signal inputted from the internal logic circuit 104 and the low-level signal to which the high-level test signal inputted from the test signal generation circuit 106 is inverted, and the logical product of the reset release signal inputted from the PoR circuit 102 and the test signal inputted from the test signal generation circuit 106. This signal is a high signal as illustrated for signal line D in FIG. 6.

The tester 124 determines that the PoR circuit 102 is functioning normally if the signal inputted from the semiconductor integrated circuit 100 during the rise of the DC voltage VDD is a low-level signal, and the signal inputted from the semiconductor integrated circuit 100 after the rise time of the DC voltage VDD has elapsed is a high-level signal.

Now, the PoR circuit 102 that is the inspection target circuit is a circuit that includes a P-channel MOS transistor that serves as a resistor (R) and an N-channel MOS transistor that serves as a capacitive element (C). Consequently, because of the time constant of an RC circuit including the P-channel MOS transistor and the N-channel MOS transistor, the signal level of the reset signal has a slow rise in a period before reaching the predetermined level. This slow rise is not preferable when determining whether the PoR circuit 102 is functioning normally from the logical values of the signals outputted from the semiconductor integrated circuit 100. In addition, the time constant of the RC circuit varies with the environments in which individual PoR circuits 102 are disposed, degrees of deterioration over time, or the like. Therefore, it has been difficult to specify when the reset release signal will be outputted, after the DC voltage VDD is applied. Accordingly, in the conventional inspection device, the function of the PoR circuit 102 has been inspected by monitoring signals outputted from the output terminal 114C while raising the voltage value of the DC voltage VDD in steps.

However, the above inspection method may only be used if the rise time of the DC voltage VDD is long (for example, of the order of milliseconds or more), and therefore inspection is difficult if the rise time of the DC voltage VDD is short (the microseconds level) due to the limitations in operation times of the tester 124.

SUMMARY OF THE INVENTION

The present invention provides an inspection device and an inspection method for accurately inspecting whether an inspection target circuit is functioning normally regardless to start-up period of a power supply voltage.

A first aspect of the present invention is an inspection device including: a trigger output section that outputs a trigger signal; a signal output section including, a first terminal, connected to an output terminal of an inspection target circuit, that outputs a first level transition signal that, using a rise of a DC voltage, transits from an initialization level, which represents a level for initializing a logic circuit when the DC voltage is applied, to an initialization release level, which represents a level for releasing an initialization state of the logic circuit, a second terminal connected to an output terminal of the trigger output section, and a third terminal connected to an input terminal of the logic circuit, wherein, the signal output section outputs, from the third terminal, a second level transition signal that transits from an initialization execution level which is the same level as the initialization level in response to the first level transition signal having the initialization level, to a release execution level which is the same level as the initialization release level in response to the trigger signal; and a determination section that determines whether the inspection target circuit is functioning normally by determining whether the signal outputted from the third terminal of the signal output section is at a predetermined level.

Thus, the inspection device of the first aspect outputs the second level transition signal. The second level transition signal, having the initialization execution level that is the same level as the initialization level, is outputted from the signal output section, when the first level transition signal having the initialization level is outputted from the output terminal of the inspection target circuit, and the second level transition signal transits from the initialization execution level to the release execution level, having the same level as the initialization release level, when the trigger signal is outputted from the output terminal of the trigger output section. Therefore, the first aspect of the present invention may accurately inspect whether the inspection target circuit is functioning normally regardless to start-up period of the DC voltage.

In a second aspect of the present invention, in the above first aspect, may further include: an output maintaining section that outputs a control signal having the same level as the initialization release level when the rise of the DC voltage applied to the inspection target circuit has ended, and that maintains the level of the control signal; and a selector including, a first input terminal connected to the third terminal, a second input terminal connected to the output terminal of the logic circuit, a control terminal connected to the output terminal of the output maintaining section, and a selector output terminal connected to the input terminal of the determination section, wherein the selector, through the selector output terminal, outputs a signal having the same level as the initialization execution level if the second level transition signal having the initialization execution level is inputted to the first input terminal, and outputs a signal having the same level as the initialization release level if the first level transition signal having the initialization release level is inputted to the first input terminal, during a period in which the control signal is inputted to the control terminal, and wherein the determination section determines whether the detection target circuit is functioning normally by determining whether the signal outputted from the selector output terminal is a predetermined signal.

In a third aspect of the present invention, in the above second aspect, the initialization level may be a low level and the initialization release level may be a high level, and the selector may be a multiplexer that outputs, through the selector output terminal, a logic sum signal representing an logical sum of, an logical product of the signal inputted to the second input terminal and a signal to which the signal outputted from the output terminal of the output maintaining section is inverted, and an logical product of the signal inputted to the first input terminal and the signal inputted to the control terminal.

In a fourth aspect of the present invention, in the above aspects, the trigger output section may output the trigger signal when the rise of the DC voltage has ended and a predetermined condition is satisfied.

In a fifth aspect of the present invention, in the above aspects, the signal output section may be a D flip-flop including an R terminal as the first terminal, a C terminal as the second terminal, a Q terminal as the third terminal, and a D terminal to which the DC voltage is applied.

A sixth aspect of the present invention is an inspection method including: outputting, from an output terminal of an inspection target circuit, a first level transition signal that, using a rise of a DC voltage, transits from an initialization level, which represents a level for initializing a logic circuit when the DC voltage is applied, to an initialization release level, which represents a level for releasing an initialization state of the logic circuit; outputting, from a third terminal of a signal output section, a second level transition signal, having an initialization execution level which is the same level as the initialization level, in response to the first level transition signal having the initialization level inputted to the first terminal, wherein the signal output section includes, a first terminal connected to the output terminal of the inspection target circuit, a second terminal, connected to an output terminal of a trigger output section, that outputs a trigger signal, and the third terminal connected to an input terminal of the logic circuit; outputting the trigger signal from the trigger output section; transiting, in response to the trigger signal, the second level transition signal from the initialization execution level to a release execution level having the same level as the initialization release level; and determining, by a determination section, whether the inspection target circuit is functioning normally by determining whether a signal outputted from the third terminal of the signal output section is at a predetermined level.

Accordingly, the inspection method of the sixth aspect of the present invention operates similarly to the inspection device of the first aspect of the present invention. Therefore, the sixth aspect of the present invention may accurately inspect whether the inspection target circuit is functioning normally regardless to start-up period of the DC voltage.

In a seventh aspect of the present invention, in the above sixth aspect, may further include: starting, by an output maintaining section, an output of a control signal having the same level as the initialization release level, when the rise of the DC voltage applied to the inspection target circuit has ended; maintaining the level of the control signal by the output maintaining section; outputting, from a selector output terminal of a selector, a signal having the same level as the initialization execution level if the second level transition signal having the initialization execution level is inputted to the first input terminal, during a period in which the control signal is inputted to a control terminal, wherein the selector includes, a first input terminal connected to the third terminal, a second input terminal connected to an output terminal of the logic circuit, a control terminal connected to an output terminal of the output maintaining section, and the selector output terminal connected to an input terminal of the determination section; and outputting, from the selector output terminal of the selector, a signal having the same level as the initialization release level if the first level transition signal having the initialization release level is inputted to the first input terminal, during a period in which the control signal is inputted to the control terminal, wherein determining, by the determination section, whether the detection target circuit is functioning normally is determined by whether a signal outputted from the selector output terminal is a predetermined signal.

In an eighth aspect of the present invention, in the above seventh aspect, the initialization level may be a low level and the initialization release level may be a high level, and the selector may be a multiplexer that outputs, through the selector output terminal, a logic sum signal representing an logical sum of, an logical product of the signal inputted to the second input terminal and a signal to which the signal outputted from the output terminal of the output maintainer is inverted, and an logical product of the signal inputted to the first input terminal and the signal inputted to the control terminal.

In a ninth aspect of the present invention, in the above aspects, the trigger output section may output the trigger signal when the rise of the DC voltage has ended and a predetermined condition is satisfied.

In a tenth aspect of the present invention, in the above aspects, the signal output section may be a D flip-flop including an R terminal as the first terminal, a C terminal as the second terminal, a Q terminal as the third terminal, and a D terminal to which the DC voltage is applied.

According to the above aspects, the present invention may accurately inspect whether the power-on reset circuit is functioning normally, regardless to start-up period of a power supply voltage.

BRIEF DESCRIPTION OF THE DRAWINGS

Exemplary embodiments of the present invention will be described in detail based on the following figures, wherein.

DETAILED DESCRIPTION OF THE INVENTION

Figure 1:
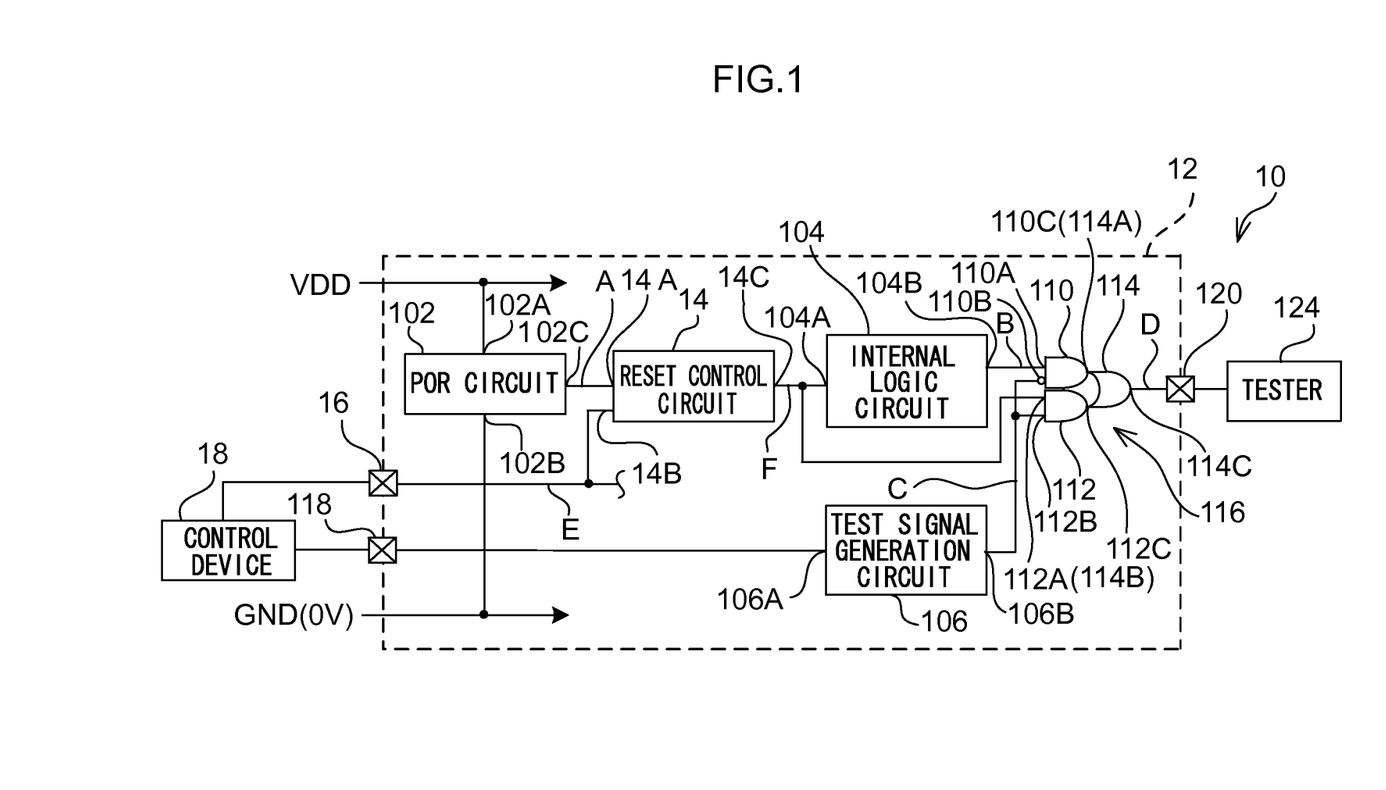
FIG. 1 is a diagram illustrating an example of an inspection device according to an exemplary embodiment.

Herebelow, exemplary embodiments of the present invention will be described in detail with reference to the attached drawings. FIG. 1 illustrates an example of configuration of an inspection device 10 according to a present exemplary embodiment. As illustrated in FIG. 1, the configuration of the inspection device 10 according to the present exemplary embodiment differs from the configuration of the inspection device 50 illustrated in FIG. 5, in that a control device 18 is employed in place of the control device 122. Further, the configuration of the inspection device 10 according to the present exemplary embodiment differs from the semiconductor integrated circuit 100 illustrated in FIG. 5, in employing a semiconductor integrated circuit 12 that is configured by incorporating a reset control circuit 14 and a trigger input terminal 16. Accordingly, in the following descriptions, portions that are the same as the inspection device 50 and the semiconductor integrated circuit 100 illustrated in FIG. 5 are assigned with same reference numerals, and descriptions thereof will be omitted.

The inspection device 10 includes elements that configure a portion of the semiconductor integrated circuit 12, the control device 18 and the tester 124. The semiconductor integrated circuit 12 differs from the semiconductor integrated circuit 100 illustrated in FIG. 5 in that the reset control circuit 14 is included, and the trigger input terminal 16 is provided. The reset control circuit 14 is provided between a connection point of the positive logic input terminal 112A of the AND circuit 112 with the signal line A and the output terminal 102C of the PoR circuit 102. The reset control circuit 14 generates a signal having the same level as the signal inputted from the PoR circuit 102, and outputs the signal to the internal logic circuit 104 and the selector circuit 116. The reset control circuit 14 includes a first input terminal 14A, a second input terminal 14B and an output terminal 14C. The first input terminal 14A is connected to the output terminal 102C of the PoR circuit 102, and the output terminal 14C is connected to the input terminal 104A of the internal logic circuit 104 via a signal line F.

The trigger input terminal 16 is connected to the second input terminal 14B of the reset control circuit 14 via a signal line E. The control device 18 differs from the control device 122 illustrated in FIG. 5, in being connected to the trigger input terminal 16 as well as to the external input terminal 118. Further, the control device 18 differs from the control device 122 in outputting a trigger signal to the reset control circuit 14 via the trigger input terminal 16. In the inspection device 10 of the present exemplary embodiment, the high level is employed as the signal level of the trigger signal. However, it is sufficient for this high-level trigger signal to be outputted only once per inspection, at a predetermined timing after the rise of the DC voltage VDD has finished.

Figure 2:
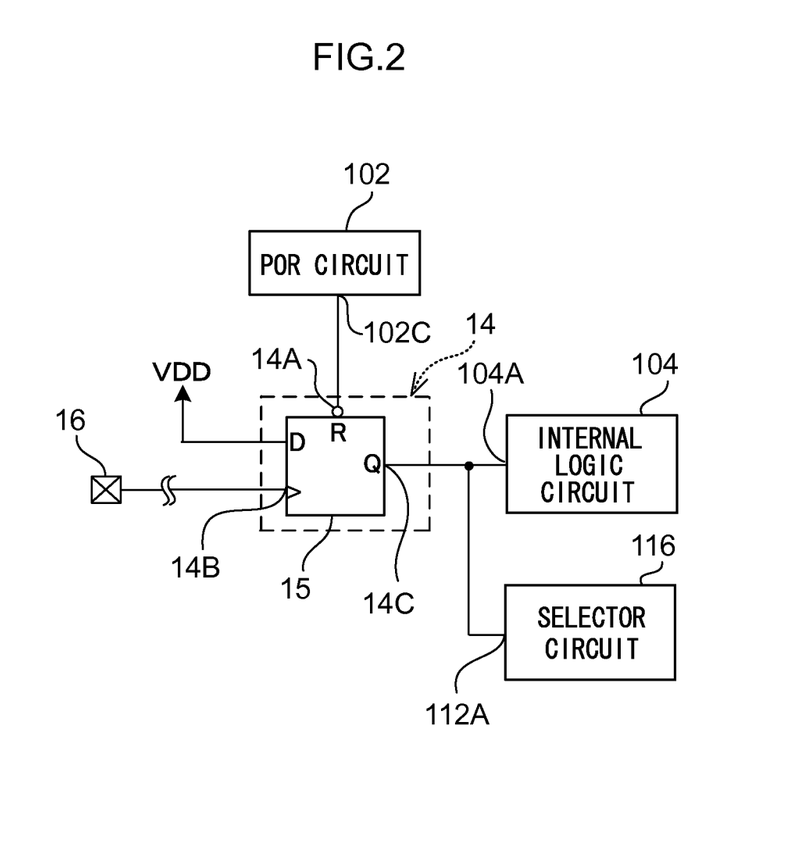
FIG. 2 is a diagram illustrating a configuration of a reset control circuit and peripherals thereof, according to the exemplary embodiment.

FIG. 2 illustrates an example configuration of the reset control circuit 14 according to the present exemplary embodiment. As illustrated in FIG. 2, the reset control circuit 14 includes a D flip-flop 15. The D flip-flop 15 includes a data terminal (D terminal), a reset terminal (R terminal), an output terminal (Q terminal) and a clock terminal (C terminal). The DC voltage VDD is applied to the data terminal (D terminal). The reset terminal (R terminal) corresponds to the first input terminal 14A, the output terminal (Q terminal) corresponds to the output terminal 14C, and the clock terminal (C terminal) corresponds to the second input terminal 14B.

Now, operation of the inspection device 10 according to the present exemplary embodiment will be described by referring to FIG. 3. Note that FIG. 3 illustrates transition states of the signal levels of signal lines A to F when a power supply of the inspection device 10 and the semiconductor integrated circuit 12 is switched on.

Figure 3:
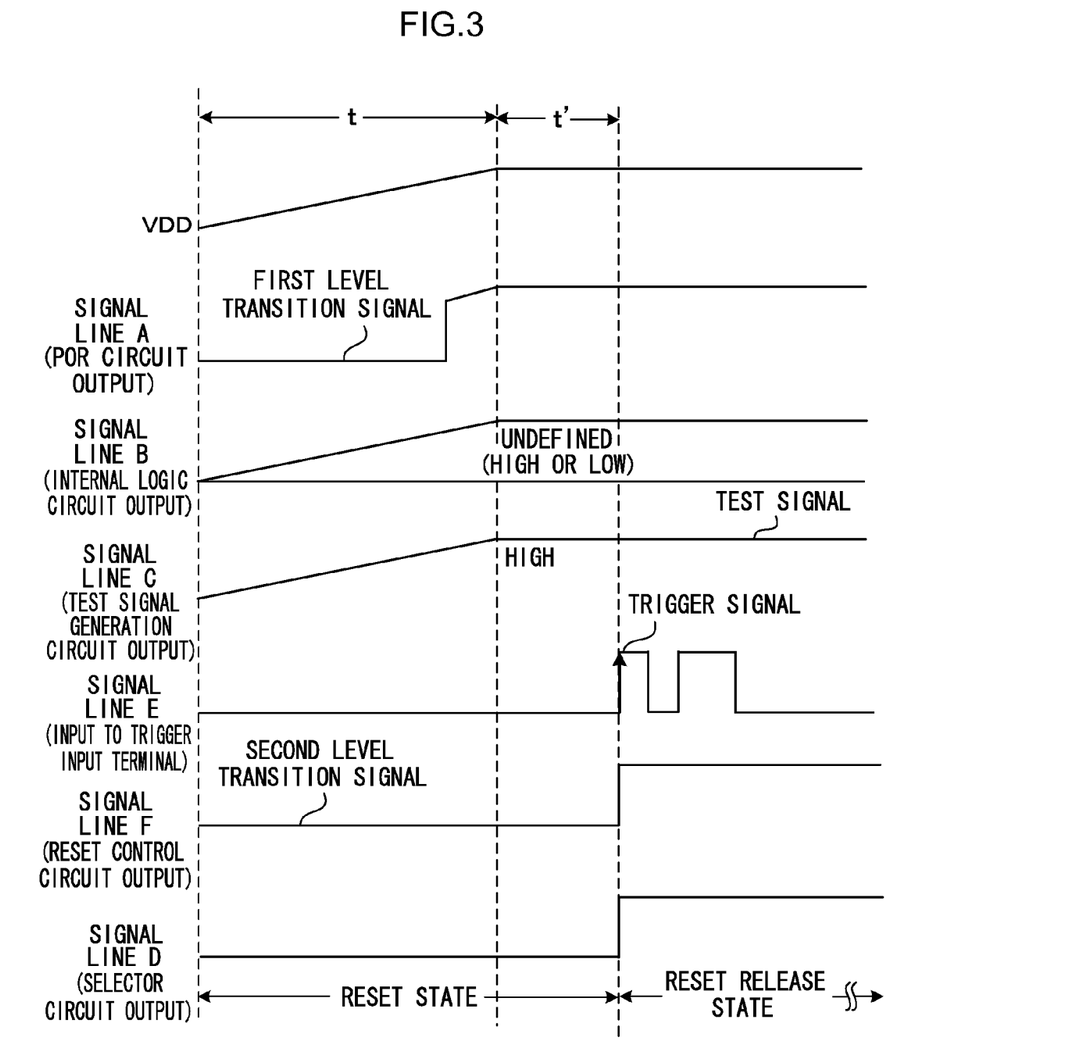
FIG. 3 is a timing chart illustrating operation timings of the inspection device according to the exemplary embodiment.

When the application of the DC voltage VDD is started, output of a low-level (initialization level) first level transition signal is started as illustrated in the timing chart for signal line A in FIG. 3. In response, the reset control circuit 14 outputs a low-level (initialization execution level) second level transition signal as illustrated in the timing chart for signal line F in FIG. 3. Consequently, the internal logic circuit 104 becomes the reset state, and outputs a high-level signal or a low-level signal as illustrated in the timing chart for signal line B in FIG. 3. In addition, the selector circuit 116 starts output of a signal representing the logical sum of, the logical product of the signal inputted from the internal logic circuit 104 and the high-level signal to which the low-level signal inputted from the test signal generation circuit 106 is inverted, and the logical product of the second level transition signal inputted from the reset control circuit 14 and the low-level signal inputted from the test signal generation circuit 106. The timing chart for signal line D in FIG. 3 shows an example of a state in which a low-level signal is transmitted through the signal line D.

As illustrated by the timing chart for signal line A in FIG. 3, when a predetermined period elapses after the signal level of the first level transition signal rises to the high level (initialization release level) using the rise of the DC voltage VDD, the control device 18 outputs a high-level trigger signal to the reset control circuit 14, and outputs an instruction signal to the test signal generation circuit 106, instructing the generation of a test signal. When the trigger signal from the control device 18 is inputted to the reset control circuit 14, the reset control circuit 14 outputs the high-level second level transition signal as illustrated in the timing chart for signal line F in FIG. 3. Consequently, the reset state of the internal logic circuit 104 is released. Meanwhile, when the instruction signal from the control device 18 is inputted to the test signal generation circuit 106, the test signal generation circuit 106 outputs the high-level test signal. At this time, the selector circuit 116 starts output of a signal representing the logical sum of, the logical product of the signal inputted from the internal logic circuit 104 (a high-level or low-level signal) and the signal (low-level) to which the test signal inputted from the test signal generation circuit 106 is inverted, and the logical product of the first level transition signal inputted from the PoR circuit 102 and the test signal inputted from the test signal generation circuit 106. Namely, the selector circuit 116 starts output of a high-level signal as illustrated in the timing chart for signal line D in FIG. 3.

Then, if the signal inputted from the semiconductor integrated circuit 12 in a period before the predetermined period has elapsed after the rise of the DC voltage VDD has finished is a low-level signal, and the signal inputted from the semiconductor integrated circuit 12 after the predetermined period has elapsed is a high-level signal, the tester 124 determines that the PoR circuit 102 is functioning normally. In other cases, namely, if the signal inputted from the semiconductor integrated circuit 12 in the period before the predetermined period has elapsed after the rise of the DC voltage VDD has finished is a high-level signal, and/or if the signal inputted from the semiconductor integrated circuit 12 after the predetermined period has elapsed is a low-level signal, the tester 124 determines that the PoR circuit 102 is not functioning normally.

Thus, in the inspection device 10 according to the present exemplary embodiment, even if the rise time t of the DC voltage VDD is short (for example, of the order of microseconds), a duration of inspection by the tester 124 may be kept longer by an amount corresponding to a period t', until the trigger signal is outputted after the end of the rise of the DC voltage VDD. Therefore, it is sufficient for the inspection device 10 of the present invention to provide the signal outputted from the external output terminal 120 only for one inspection. Thus, the inspection device 10 according to the present exemplary embodiment does not need to perform inspections by finely raising the DC voltage VDD in steps as in the conventional inspection device, and duration of inspection may be greatly reduced. Furthermore, in the conventional inspection device the rising rate of the reset signal from the PoR circuit 102 is slowed because of the time constant of the RC circuit, and therefore it is difficult to specify at what point in time the reset release should be started. In contrast, in the inspection device 10 according to the present exemplary embodiment, since the inspection target is the second level transition signal with a signal level corresponding to the signal level of the first level transition signal (the high level), the point of the start of the reset release may be easily specified.

As has been described in detail hereabove, according to the inspection device 10 of the present exemplary embodiment, the control device 18, the reset control circuit 14 and the tester 124 are provided, and the reset control circuit 14 includes the first input terminal 14A that serves as a first terminal connected to the output terminal 102C of the PoR circuit 102, the second input terminal 14B that serves as a second terminal connected to the output terminal of the control device 18, and the output terminal 14C that serves as a third terminal connected to the input terminal 104A of the internal logic circuit 104.

Further, the control device 18 according to the present exemplary embodiment operates as a trigger output section that outputs the trigger signal.

Further, the output terminal 102C of the PoR circuit 102 according to the present exemplary embodiment outputs the first level transition signal that uses the rise of the DC voltage VDD to transit from the low level (initialization level), which represents a level for resetting the internal logic circuit 104 that serves as a logic circuit when the DC voltage VDD has been applied, to the high level (initialization release level), which represents a level for releasing the reset state of the internal logic circuit 104.

Further, the reset control circuit 14 according to the present exemplary embodiment outputs, from the output terminal 14C, the second level transition signal, that transits from the low level (initialization execution level) that is the same level as the low level (initialization level) in response to the low-level first level transition signal inputted from the output terminal 102C of the PoR circuit 102 to the first input terminal 14A, to the high level (release execution level) in response to the trigger signal inputted from the output terminal of the control device 18 to the second input terminal 14B.

Furthermore, the tester 124 according to the present exemplary embodiment determines whether the PoR circuit 102 is functioning normally by determining whether the second level transition signal outputted from the output terminal 14C of the reset control circuit 14 is at predetermined levels.

Thus, the inspection device 10 according to the present exemplary embodiment may accurately inspect whether the PoR circuit 102 is functioning normally regardless to start-up period of the DC voltage VDD.

According to the inspection device 10 of the present exemplary embodiment, the test signal generation circuit 106 and the selector circuit 116 are included.

When the rise of the DC voltage VDD applied to the PoR circuit 102 ends, the test signal generation circuit 106 starts output of the test signal that serves as a control signal and has the same level as the first level transition signal, and operates as an output maintaining section that maintains the level of the test signal.

The selector circuit 116 includes the positive logic input terminal 112A, the positive logic input terminal 110A, the negative logic input terminal 110B, the positive logic input terminal 112B, and the output terminal 14C. The positive logic input terminal 112A is connected to the output terminal 14C of the reset control circuit 14, and operates as the first input terminal. The positive logic input terminal 110A is connected to the output terminal 104B of the internal logic circuit 104, and operates as the second input terminal. The negative logic input terminal 110B and the positive logic input terminal 112B are connected to the output terminal 106B of the test signal generation circuit 106. The output terminal 114C is connected to the input terminal of the tester 124.

The selector circuit 116 outputs a low-level signal through the output terminal 14C when the low-level second level transition signal is inputted from the output terminal 14C to the positive logic input terminal 112A, in the period in which the test signal is inputted from the output terminal 106B of the test signal generation circuit 106 to the negative logic input terminal 110B and the positive logic input terminal 112B. Then, when the high-level first level transition signal is inputted from the output terminal 14C to the positive logic input terminal 112A in the period in which the test signal is inputted from the output terminal 106B of the test signal generation circuit 106 to the negative logic input terminal 110B and the positive logic input terminal 112B, the selector circuit 116 outputs a signal having the same level as the low-level first level transition signal from the output terminal 14C.

According to the inspection device 10 of the present exemplary embodiment, the tester 124 determines whether the PoR circuit 102 is functioning normally by determining whether signals outputted from the output terminal 114C are predetermined signals.

Thus, the inspection device 10 of the present exemplary embodiment may accurately inspect whether the PoR circuit 102 is functioning normally while signals with stable signal levels are outputted from the internal logic circuit 104.

According to the inspection device 10 of the present exemplary embodiment, the level of the reset signal is the low level and the level of the reset release signal is the high level, and the selector circuit 116 is a multiplexer.

This multiplexer outputs, through the output terminal 114C to the negative logic input terminal 110B and the positive logic input terminal 112B, a logic sum signal representing the logical sum of, the logical product of the signal inputted from the output terminal 104B of the internal logic circuit 104 to the positive logic input terminal 110A and the signal to which the signal outputted from the output terminal 106B of the test signal generation circuit 106 is inverted, and the logical product of the signal inputted from the output terminal 14C of the reset control circuit 14 to the positive logic input terminal 112A and the signal inputted from the output terminal 106B of the test signal generation circuit 106.

Thus, the signal level of the signal outputted from the internal logic circuit 104 is stabilized and the inspection device 10 may accurately and easily inspect whether the PoR circuit 102 is functioning normally.

According to the inspection device 10 of the present exemplary embodiment, the control device 18 outputs the trigger signal when predetermined period has elapsed after the rise of the DC voltage VDD has ended. Therefore, in the inspection device 10 according to the present exemplary embodiment, the point of time at which the reset is released may be accurately specified.

According to the inspection device 10 of the present exemplary embodiment, the D flip-flop 15 is used as the reset control circuit 14 and therefore, an increase in size of the circuit may be prevented. The D flip-flop 15 of the present exemplary embodiment includes the R terminal that serves as the first input terminal 14A, the C terminal that serves as the second input terminal 14B, the Q terminal that serves as the output terminal 14C, and the D terminal to which the DC voltage VDD is applied.

Figure 4:
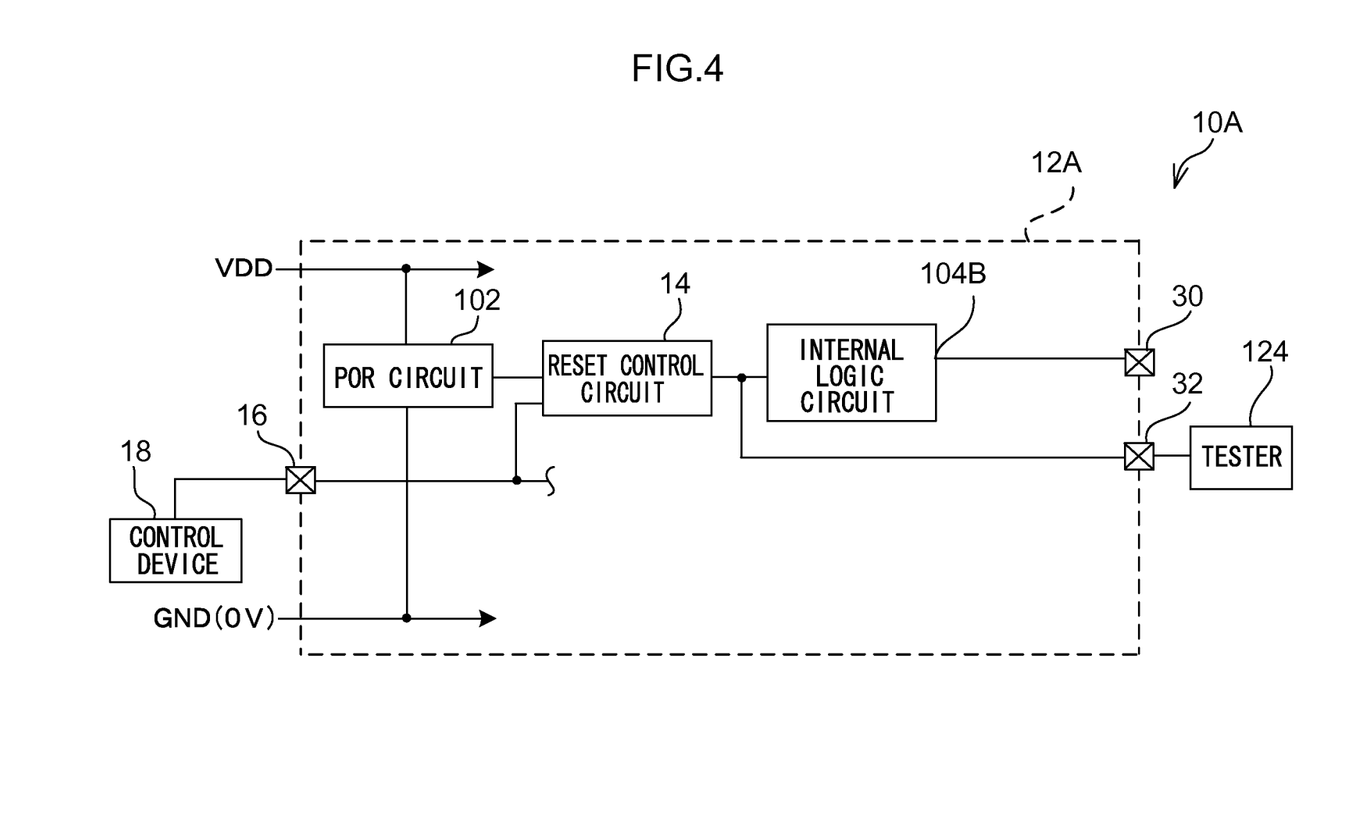
FIG. 4 is a diagram illustrating an another example of the inspection device according to the exemplary embodiment.

In the exemplary embodiment described above, a case in which it is determined whether the PoR circuit 102 is functioning normally by determining whether signals outputted from the selector circuit 116 are predetermined signals. However, the present invention is not limited thereto. For example, the signal outputted from the output terminal 14C of the reset control circuit 14 may be directly monitored to determine whether the PoR circuit 102 is functioning normally. An example of for such case is illustrated in FIG. 4. An inspection device 10A illustrated in FIG. 4 differs from the inspection device 10 illustrated in FIG. 1 in that a semiconductor integrated circuit 12A is employed instead of the semiconductor integrated circuit 12. The semiconductor integrated circuit 12A differs from the semiconductor integrated circuit 12 in that the test signal generation circuit 106, the selector circuit 116 and the external input terminal 118 are removed, and new exterior output terminals 30 and 32 are provided.

The output terminal 104B of the internal logic circuit 104 is connected to the exterior output terminal 30, and the output terminal 14C of the reset control circuit 14 is connected to the input terminal of the tester 124 via the exterior output terminal 32. Accordingly, the tester 124 determines whether the signal inputted from the semiconductor integrated circuit 12 is the low-level second level transition signal in the period before the predetermined period has elapsed after the end of the rise of the DC voltage VDD. Then the tester 124 determines that the PoR circuit 102 is functioning normally if the signal level of the second level transition signal transits to the high level after predetermined period has elapsed. In other cases, namely, if the signal inputted from the semiconductor integrated circuit 12 is not the low-level second level transition signal in the period before the predetermined period has elapsed after the end of the rise of the DC voltage VDD, the tester 124 determines that the PoR circuit 102 is not functioning normally.

In the exemplary embodiment described above, a case in which the trigger signal is outputted at the point when predetermined period has elapsed after the end of the rise of the DC voltage VDD, has been described. However, for example, if other semiconductor integrated circuits are connected to the semiconductor integrated circuit 12 and communications are performed between the semiconductor integrated circuits, a transmission start signal (for example a signal for polling) that is used when starting communication between the semiconductor integrated circuits, after the rise of the DC voltage VDD has ended, may be utilized as the trigger signal. Alternatively, if the semiconductor integrated circuit 12 is incorporated in an electronic device that includes an oscillation circuit, a signal outputted from the oscillation circuit may be utilized as the trigger signal. For such case, as an example, a selector circuit may be provided in a transmission path between the oscillation circuit and the semiconductor integrated circuit 12, so as not to enter the reset state during inspection, and the signal from the selector circuit may be outputted at the output timing mentioned above.

In the exemplary embodiment described above, a case in which a low-level active reset signal that performs a reset when the signal level is the low level is employed, has been described. However, a high-level active reset signal that performs a reset when the signal level is the high level, may be employed.

In the exemplary embodiment described above, a case in which the reset execution signal and the reset release execution signal are outputted by the D flip-flop, 15 has been described. However, a D latch may be employed in place of the D flip-flop 15. Any kind of circuit that includes latching function may be employed.

In the exemplary embodiment described above, a case in which the control device 18 and the tester 124 are provided outside the semiconductor integrated circuit 12, has been described. However, one or both of the control device 18 and the tester 124 may be incorporated in the semiconductor integrated circuit 12.

In the exemplary embodiment described above, a case in which the reset control circuit 14, the test signal generation circuit 106 and the selector circuit 116 are configured by hardware, has been described. However, the functions of one or more of the reset control circuit 14, the test signal generation circuit 106 and the selector circuit 116 may be configured by software, such as by memory and a program or the like, if the respective lengths of the periods t and t' are long (for example, of the order of milliseconds or more). In such a case, a computer may be caused to function as one or more reset control sections corresponding to the reset control circuit 14, a test signal generation section corresponding to the test signal generation circuit 106 and a selector section corresponding to the selector circuit 116. This program may be memorized in advance in a read-only memory (ROM) and the program executed by a CPU.

What is claimed is:

1. An inspection device comprising:
    a trigger output section that outputs a trigger signal;
    a signal output section including,
        a first terminal, connected to an output terminal of an inspection target circuit, that outputs a first level transition signal that, using a rise of a DC voltage, transits from an initialization level, which represents a level for initializing a logic circuit when the DC voltage is applied, to an initialization release level, which represents a level for releasing an initialization state of the logic circuit,
        a second terminal connected to an output terminal of the trigger output section, and
        a third terminal connected to an input terminal of the logic circuit,
        wherein, the signal output section outputs, from the third terminal, a second level transition signal that transits from an initialization execution level which is the same level as the initialization level in response to the first level transition signal having the initialization level, to a release execution level which is the same level as the initialization release level in response to the trigger signal; and
    a determination section that determines whether the inspection target circuit is functioning normally by determining whether the signal outputted from the third terminal of the signal output section is at a predetermined level.

2. The inspection device according to claim 1, further comprising:
    an output maintaining section that outputs a control signal having the same level as the initialization release level when the rise of the DC voltage applied to the inspection target circuit has ended, and that maintains the level of the control signal; and
    a selector including,
        a first input terminal connected to the third terminal,
        a second input terminal connected to the output terminal of the logic circuit,
        a control terminal connected to the output terminal of the output maintaining section, and
        a selector output terminal connected to the input terminal of the determination section,
        wherein the selector, through the selector output terminal, outputs a signal having the same level as the initialization execution level if the second level transition signal having the initialization execution level is inputted to the first input terminal, and outputs a signal having the same level as the initialization release level if the first level transition signal having the initialization release level is inputted to the first input terminal, during a period in which the control signal is inputted to the control terminal,
    wherein the determination section determines whether the detection target circuit is functioning normally by determining whether the signal outputted from the selector output terminal is a predetermined signal.

3. The inspection device according to claim 2, wherein the initialization level is a low level and the initialization release level is a high level, and wherein the selector is a multiplexer that outputs, through the selector output terminal, a logic sum signal representing an logical sum of, an logical product of the signal inputted to the second input terminal and a signal to which the signal outputted from the output terminal of the output maintaining section is inverted, and an logical product of the signal inputted to the first input terminal and the signal inputted to the control terminal.

4. The inspection device according to claim 1, wherein the trigger output section outputs the trigger signal when the rise of the DC voltage has ended and a predetermined condition is satisfied.

5. The inspection device according to claim 1, wherein the signal output section is a D flip-flop including an R terminal as the first terminal, a C terminal as the second terminal, a Q terminal as the third terminal, and a D terminal to which the DC voltage is applied.

6. An inspection method comprising:
outputting, from an output terminal of an inspection target circuit, a first level transition signal that, using a rise of a DC voltage, transits from an initialization level, which represents a level for initializing a logic circuit when the DC voltage is applied, to an initialization release level, which represents a level for releasing an initialization state of the logic circuit;
outputting, from a third terminal of a signal output section, a second level transition signal, having an initialization execution level which is the same level as the initialization level, in response to the first level transition signal having the initialization level inputted to the first terminal, wherein the signal output section includes, a first terminal connected to the output terminal of the inspection target circuit, a second terminal, connected to an output terminal of a trigger output section, that outputs a trigger signal, and the third terminal connected to an input terminal of the logic circuit;
outputting the trigger signal from the trigger output section;
transiting, in response to the trigger signal, the second level transition signal from the initialization execution level to a release execution level having the same level as the initialization release level; and
determining, by a determination section, whether the inspection target circuit is functioning normally by determining whether a signal outputted from the third terminal of the signal output section is at a predetermined level.

7. The inspection method according to claim 6, further comprising:

starting, by an output maintaining section, an output of a control signal having the same level as the initialization release level, when the rise of the DC voltage applied to the inspection target circuit has ended;
maintaining the level of the control signal by the output maintaining section;
outputting, from a selector output terminal of a selector, a signal having the same level as the initialization execution level if the second level transition signal having the initialization execution level is inputted to the first input terminal, during a period in which the control signal is inputted to a control terminal, wherein the selector includes, a first input terminal connected to the third terminal, a second input terminal connected to an output terminal of the logic circuit, a control terminal connected to an output terminal of the output maintaining section, and the selector output terminal connected to an input terminal of the determination section; and
outputting, from the selector output terminal of the selector, a signal having the same level as the initialization release level if the first level transition signal having the initialization release level is inputted to the first input terminal, during a period in which the control signal is inputted to the control terminal,
wherein determining, by the determination section, whether the detection target circuit is functioning normally is determined by whether a signal outputted from the selector output terminal is a predetermined signal.

8. The inspection method according to claim 7, wherein the initialization level is a low level and the initialization release level is a high level, and
wherein the selector is a multiplexer that outputs, through the selector output terminal, a logic sum signal representing an logical sum of, an logical product of the signal inputted to the second input terminal and a signal to which the signal outputted from the output terminal of the output maintainer is inverted, and an logical product of the signal inputted to the first input terminal and the signal inputted to the control terminal.

9. The inspection method according to claim 6, wherein the trigger output section outputs the trigger signal when the rise of the DC voltage has ended and a predetermined condition is satisfied.

10. The inspection method according to claim 6, wherein the signal output section is a D flip-flop including an R terminal as the first terminal, a C terminal as the second terminal, a Q terminal as the third terminal, and a D terminal to which the DC voltage is applied.

* * * * *